(12) United States Patent
Spencer

(10) Patent No.: US 7,419,565 B2
(45) Date of Patent: Sep. 2, 2008

(54) METHOD FOR ENCAPSULATING

(75) Inventor: Timothy F. Spencer, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 560 days.

(21) Appl. No.: 11/048,400

(22) Filed: Feb. 1, 2005

(65) Prior Publication Data

US 2006/0169402 A1    Aug. 3, 2006

(51) Int. Cl.
*B29C 65/48* (2006.01)

(52) U.S. Cl. .................. 156/295; 264/571; 264/272.16; 264/511; 264/261; 445/24; 445/25

(58) Field of Classification Search .................. 156/285, 156/295; 264/272.16, 261, 511, 571; 445/24, 445/25; 425/388
See application file for complete search history.

(56) References Cited

U.S. PATENT DOCUMENTS

| | | | |
|---|---|---|---|
| 4,619,624 A * | 10/1986 | Kerr et al. ...................... | 445/22 |
| 6,224,706 B1 * | 5/2001 | Matich ........................ | 156/212 |
| 6,304,308 B1 | 10/2001 | Saito et al. | |
| 6,373,547 B2 | 4/2002 | Saito et al. | |
| 6,731,369 B2 | 5/2004 | Choo | |
| 2001/0022401 A1 | 9/2001 | Nakamura | |
| 2002/0070663 A1 | 6/2002 | Ogura et al. | |
| 2002/0121860 A1 | 9/2002 | Seo et al. | |
| 2002/0155320 A1 * | 10/2002 | Park et al. ................... | 428/690 |
| 2003/0007117 A1 | 1/2003 | McKnight et al. | |
| 2004/0095060 A1 | 5/2004 | Ushifusa et al. | |

FOREIGN PATENT DOCUMENTS

WO        02/21557        3/2002

* cited by examiner

*Primary Examiner*—Richard Crispino
*Assistant Examiner*—Christopher Schatz
(74) *Attorney, Agent, or Firm*—Andrew J. Anderson

(57) ABSTRACT

A method for encapsulating an area on a substrate comprising the steps of a) providing a substrate having an area on a surface thereof which is to be encapsulated, b) providing an assembly fixture which has features formed into the surface of the fixture, and vacuum orifices associated with the features of the fixture, c) positioning a substantially flat formable sheet onto the assembly fixture, and forming the sheet to the features of the assembly fixture by applying a negative pressure through the vacuum orifices, wherein corresponding features are formed in the sheet, d) patterning an adhesive onto the sheet or onto the substrate, the adhesive pattern corresponding to the perimeter of the area on the substrate to be encapsulated, e) clamping together the substrate and the sheet, causing the patterned adhesive to flow between the substrate and sheet in the area of compression, wherein the patterned adhesive is proximate to the features formed in the sheet, and f) curing the adhesive to form a perimeter seal between the substrate and the sheet.

16 Claims, 2 Drawing Sheets

DETAIL A

DETAIL A

DETAIL A

METHOD FOR ENCAPSULATING

FIELD OF THE INVENTION

The present invention relates to a method for encapsulating an area on a substrate with a formable sheet, and more particularly to a method of sealing environmentally sensitive devices such as of organic thin-film light emitting devices which may be utilized in flat panel displays or flat panel illumination sources constructed on glass substrates.

BACKGROUND OF THE INVENTION

Organic thin-film light emitting devices are known to be exquisitely sensitive to water vapor and oxygen. Exposure to either of these materials results in the rapid degradation and failure of the devices, reducing or destroying the utility of the flat panel display or flat panel illumination source utilizing these devices. A number of approaches have been developed to seal the organic thin-film devices to eliminate exposure to oxygen and water vapor. The most commonly used approach in commercial application is to apply an adhesive between the substrate and a cover and then use a variety of means, such as UV exposure to accelerate the curing of the adhesive.

A key limitation of this approach lies in dispensing a controlled bead of adhesive such that the adhesive bead contains neither too much adhesive, nor too little adhesive. If too much adhesive is present the excess may flow into the active display or electronic areas when the substrate and cover are squeezed together. If too little adhesive is present, this may result in gaps in the perimeter seal.

Prior art discloses the use of etched features in the cap or substrate which can help limit the spread of adhesive in a direction perpendicular to the axis of the seal. Patent WO 02/21557 A1 discloses the use of a sealing dam etched into the glass substrate. The sealing dam not only provides appropriate spacing between the substrate and the cap, but also prevents the adhesive from flowing into the device area and damaging the display medium. Publication 2003/0007117 A1 discloses the use of an etched channel in the substrate or cap providing a reservoir of extra volume for adhesive to flow into during assembly thereby preventing the adhesive seal from encroaching into the display area of the device. Etching processes, however, can add significant cost to the overall device, and furthermore dictate the use of thicker materials in order to provide sufficient depth to form the encapsulating features.

There is a need therefore, for an improved method for encapsulating an area on a substrate which provides well defined, high quality sealing features without the use of an expensive etching processes.

SUMMARY OF THE INVENTION

In accordance with one embodiment, the invention is directed towards a method for encapsulating an area on a substrate comprising the steps of a) providing a substrate having an area on a surface thereof which is to be encapsulated, b) providing an assembly fixture which has features formed into the surface of the fixture, and vacuum orifices associated with the features of the fixture, c) positioning a substantially flat formable sheet onto the assembly fixture, and forming the sheet to the features of the assembly fixture by applying a negative pressure through the vacuum orifices, wherein corresponding features are formed in the sheet, d) patterning an adhesive onto the sheet or onto the substrate, adhesive pattern corresponding to the perimeter of the area on the substrate to be encapsulated, e) clamping together the substrate and the sheet, causing the patterned adhesive to flow between the substrate and sheet in the area of compression, wherein the patterned adhesive is proximate to the features formed in the sheet, and f) curing the adhesive to form a perimeter seal between the substrate and the sheet.

The present invention enables the efficient creation of assembly features in an encapsulating cover which limit the flow of adhesive, without incurring additional pre-processing steps. In one particular embodiment, the invention is directed towards formation of a display device comprising a display medium, a transparent substrate, a thin encapsulating foil that may be held in place during manufacture on an assembly platen, and a UV curable adhesive.

As the formable sheet encapsulating cover may be positioned precisely relative to the substrate and may be held in place with vacuum, the present invention utilizes a vacuum assembly platen to also form features in the sheet. These features may be used to enable precise control of the final width of the adhesive bond, as well as to provide clearance for a desiccant or other features specific to the particular device to be encapsulated.

DETAILED DESCRIPTION OF THE INVENTION

Figure 1:
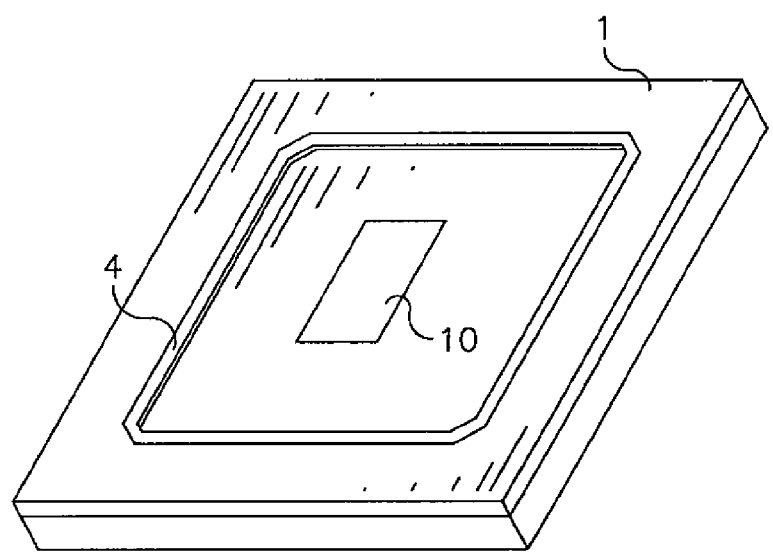
FIG. 1 is a diagram of an assembly fixture which may be employed in accordance with an embodiment of the invention.
Figure 2:
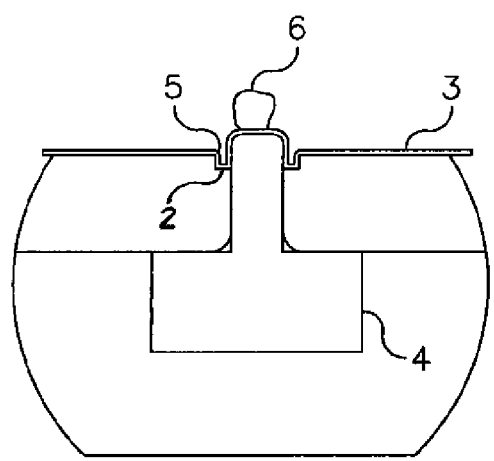
FIG. 2 is a cross sectional diagram of an assembly fixture showing a formable sheet in the vacuum formed state against the assembly fixture.
Figure 2:
Figure 3:
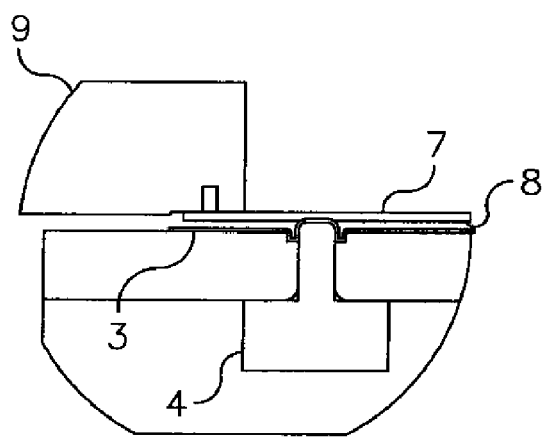
FIG. 3 is a cross sectional diagram of an assembly fixture, shown with a substrate clamped in place against a formed sheet.
Figure 3:
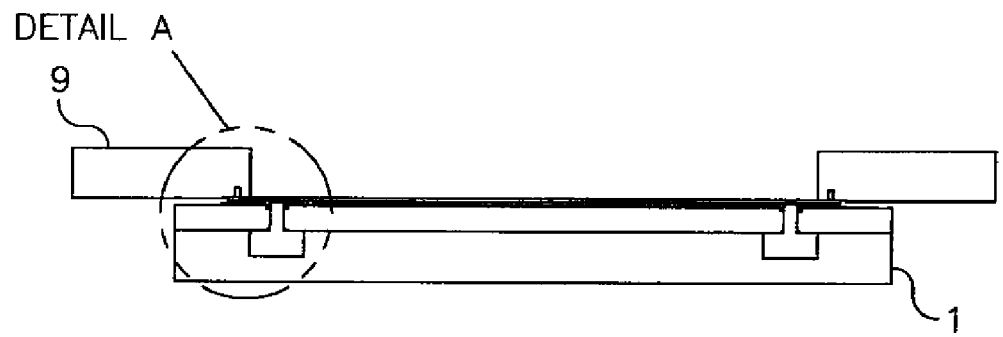

FIGS. 1, 2, and 3 show various views of a vacuum assembly platen fixture (1) that may be used to position a formable sheet (3) in an encapsulation process in accordance with the present invention. The flat, unformed sheet (3) may be positioned on the assembly fixture (1) and held in place by vacuum supplied in vacuum orifice grooves (2) on the platen which are proximate to a gasket (4) protruding above the general platen surface. The vacuum grooves (2) grip the sheet rigidly in place against the gasket (4). The gasket (4) and grooves (2) thus comprise features formed into the surface of the fixture (1). Such features may be machined, or manufactured by other conventional tool fabrication processes (e.g., etching, welding, molding, etc.). The exact desired features of the platen may depend upon the material properties and thickness of the formable sheet employed.

As shown in FIG. 2, the formable sheet (3) is held down and forced to conform to the shape of the gasket (4) and vacuum orifice grooves (2) on the platen by the vacuum in the assembly fixture, thereby creating two corresponding groove features (5) in the foil immediately adjacent to the gasket (4). A bead of adhesive (6), such as Resin Technology Millennium, may then be dispensed onto the sheet, directly above the gasket (4), in proximity to the formed groove features (5).

FIG. 3 shows a transparent substrate (7) with display medium layers (8) deposited thereon placed on the formed sheet (3), with the display medium layers on the side adjacent to the formed sheet. The groove features (5) formed in the sheet and the deposited bead of adhesive (6) are patterned to correspond to the desired perimeter of the area on the substrate to be encapsulated. While FIG. 2 illustrates the case wherein the adhesive is patterned deposited onto the sheet (3)

after the features are formed in the sheet, the adhesive alternatively may be pre-patterned onto the sheet prior to forming it on the assembly fixture. As a further alternative, the adhesive may be patterned onto the display medium side of substrate (7) prior to clamping the substrate and sheet together and then placed in alignment with the gasket (4) when the substrate is placed upon the formed sheet.

As the substrate is clamped down via a clamping mechanism (9) onto the formed sheet, the adhesive flows in the area of compression across the width of the gasket (4) with any excess adhesive flowing into the vacuum formed groove features (5). Further spread of the adhesive is limited by the lack of clamping pressure in the area of the groove features. While FIGS. 1-3 illustrate formation of groove features (5) on each side of the adhesive bead (6), the features may be formed on either single side to inhibit the spread of adhesive outward from the area to be encapsulated or to inhibit the spread of adhesive into the area to be encapsulated, as well as on both sides to inhibit the spread of adhesive in both directions.

The entire assembly platen may then be transferred to a curing energy source to cure the adhesive. Depending upon the type of adhesive employed, the cure energy may be supplied, e.g., as heat through sheet (3) (e.g., when in the form of a conductive metallic foil), or as UV radiation through a transparent substrate (7). An encapsulating perimeter seal is thus formed by the adhesive (6) between the substrate (7) and sheet (3).

Simultaneously to forming groove features (5) which are intended to be proximate to the patterned adhesive, other additional features may also be vacuum formed in the formable sheet, such as pockets (not shown) useful, e.g., for placement of a desiccating material prior to clamping together the substrate and sheet to absorb any moisture which is initially present in the package, or which penetrates a permeable adhesive perimeter seal. Alternatively, a pocket may be formed to provide clearance for material affixed to a device substrate, such as for display medium layers (8) and/or a desiccating material provided on substrate (7). Such pockets may be formed, e.g., by providing a corresponding depression (10) in the platen as illustrated in FIG. 1, along with associated vacuum orifices.

Material properties of any materials selected for platen (1) and formable sheet (3) must be such to enable formation of formed features in the formable sheet corresponding to features in the platen surface upon application of a vacuum. Preferred materials for platen 1 include metals (such as aluminum or stainless steel), machineable polymers (such as Delrin$^S$), or any of a variety of moldable polymers (such as polycarbonates). Preferred materials for use as the formable sheet include coated polymer films (such as Mitsubishi Techbarrier$^S$ Film, or Dupont Mylar$^S$ Film), metal foils (such as aluminum), and polymer-foil laminate structures. While the formable sheet may be any thickness which enables formation of features corresponding the platen surface upon application of a vacuum, a thin sheet thickness of less than 0.01 inch is preferred to enable use of relatively lower vacuum levels than would be required for thicker sheets. In a particular embodiment, the thin formable sheet (3) may comprise a 0.002" aluminum foil, the vacuum grooves (2) may be approximately 3 mm wide by 3 mm deep, and the gasket (4) may protrude 0.1 mm above the general platen surface. In this embodiment, a preferred level of vacuum may be −0.85 bars.

In a preferred embodiment, substrate (7) comprises the substrate of a display device, and in particular a display device where the sheet and perimeter seal encapsulate environmentally sensitive components of the device. In particular, the present invention may be employed to encapsulate a display device that includes Organic Light Emitting Diodes (OLEDs) which are composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light emitting diode materials can be used to fabricate such a device. In preferred embodiments, the present invention is employed with such devices fabricated on transparent glass substrates, and further preferably where a thin metal foil is employed as the formable sheet used to form the encapsulating cover of such devices.

The invention has been described in detail with particular reference to certain preferred embodiments thereof, but it will be understood that variations and modifications can be effected within the spirit and scope of the invention.

PARTS LIST

1 Assembly platen fixture
2 Vacuum groove in the assembly fixture
3 Formable sheet
4 Gasket
5 Vacuum formed groove features in the sheet
6 Adhesive bead
7 Substrate
8 Deposited display medium layers
9 Clamping mechanism
10 Depression for forming pocket in sheet

The invention claimed is:

1. A method for encapsulating an area on a substrate with an encapsulating perimeter seal comprising the steps of
   a) providing a substrate having an area on a surface thereof which is to be encapsulated,
   b) providing an assembly fixture which has features formed into the surface of the fixture, and vacuum orifices associated with the features of the fixture,
   c) positioning a substantially flat formable sheet onto the assembly fixture, and forming the sheet to the features of the assembly fixture by applying a negative pressure through the vacuum orifices, wherein corresponding features are formed in the sheet,
   d) patterning a bead of adhesive onto the sheet or onto the substrate, the patterned bead of adhesive corresponding to the perimeter of the area on the substrate to be encapsulated,
   e) clamping together the substrate and the sheet, causing the patterned bead of adhesive to flow between the substrate and sheet in the area of compression, wherein the patterned bead of adhesive is proximate to the features formed in the sheet, and wherein the features formed in the sheet inhibit the spread of adhesive into the area to be encapsulated, and
   f) curing the adhesive to form a perimeter seal between the substrate and the sheet.

2. A method as in claim 1, wherein the features formed in the sheet inhibit the spread of adhesive outward from the area to be encapsulated.

3. A method as in claim 1, wherein additional features form a pocket in the sheet within the area to be encapsulated, and further comprising adding a desiccating material into the pocket prior to clamping together the substrate and sheet.

4. A method as in claim 1, wherein additional features form a pocket in the formed sheet to provide clearance for a desiccating material affixed to the substrate.

5. The method of claim 1, wherein the substrate is transparent and the adhesive is cured by UV energy through the transparent substrate.

6. The method of claim 1, wherein the sheet comprises a metal foil and the adhesive is cured by thermal energy through the metal foil.

7. The method of claim 1, wherein the adhesive is pre-patterned onto the sheet prior to forming it on the assembly fixture.

8. The method of claim 1, wherein the adhesive is patterned onto the sheet after the features are formed in the sheet.

9. The method of claim 1, wherein the adhesive is patterned onto the substrate prior to clamping the substrate and sheet together.

10. The method of claim 1, wherein a polymer film is used as the formable sheet.

11. The method of claim 1, wherein a metal foil is used as the formable sheet.

12. The method of claim 1, wherein a laminate structure is used as the formable sheet.

13. The method of claim 1, wherein the substrate is transparent.

14. The method of claim 1, wherein the substrate is the substrate of a display device.

15. The method of claim 1, wherein the substrate is the substrate of an OLED device, and the sheet and perimeter seal encapsulate environmentally sensitive components of the OLED device.

16. The method of claim 1, wherein the substrate is the substrate of a flat panel display or flat panel illumination source.

* * * * *